United States Patent
Ko et al.

(10) Patent No.: US 11,417,847 B2
(45) Date of Patent: Aug. 16, 2022

(54) METHOD FOR MANUFACTURING DISPLAY SUBSTRATE

(71) Applicants: BOE Technology Group Co., Ltd., Beijing (CN); Chengdu BOE Optoelectronics Technology Co., Ltd., Chengdu (CN)

(72) Inventors: Youngyik Ko, Beijing (CN); Wanli Dong, Beijing (CN); Hongwei Ma, Beijing (CN)

(73) Assignees: BOE Technology Group Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 164 days.

(21) Appl. No.: 16/154,879

(22) Filed: Oct. 9, 2018

(65) Prior Publication Data
US 2019/0140196 A1 May 9, 2019

(30) Foreign Application Priority Data
Nov. 3, 2017 (CN) .......................... 201711070639.7

(51) Int. Cl.
*H01L 51/00* (2006.01)
*C23C 16/455* (2006.01)
(Continued)

(52) U.S. Cl.
CPC ........ *H01L 51/0096* (2013.01); *C23C 16/042* (2013.01); *C23C 16/45559* (2013.01); *C23C 16/50* (2013.01); *B05D 1/02* (2013.01); *B05D 1/32* (2013.01); *B05D 1/36* (2013.01); *B05D 5/12* (2013.01); *H01L 51/56* (2013.01); *H05K 3/143* (2013.01); *H05K 3/146* (2013.01); *H05K 3/427* (2013.01)

(58) Field of Classification Search
USPC ......................................................... 427/96.8
See application file for complete search history.

(56) References Cited

U.S. PATENT DOCUMENTS

| 9,041,284 B2 * | 5/2015 | Naijo ..................... H05B 33/04 313/511 |
| 2008/0187682 A1 * | 8/2008 | Park .................. H01J 37/32697 427/569 |

(Continued)

*Primary Examiner* — Brian K Talbot
(74) *Attorney, Agent, or Firm* — Fay Sharpe LLP (57) ABSTRACT

A method for manufacturing a display substrate, a display substrate, a display panel and a display device are provided. The method includes: disposing a mask plate including an occlusion area above a base substrate, an orthographic projection of occlusion area on the base substrate partially overlapping a folding area of the base substrate; forming an inorganic layer pattern with an opening on the base substrate by using mask plate, an orthographic projection of opening on the base substrate partially overlapping the folding area of base substrate. An orthographic projection of opening on the base substrate partially overlaps the folding area of base substrate. The folding area of base substrate is occluded by mask plate. The inorganic layer is formed on the base substrate by using mask plate. Effect of conveniently and quickly removing a portion the inorganic layer located in the folding area can be achieved without removing the portion.

6 Claims, 8 Drawing Sheets

(51) Int. Cl.

| | | |
|---|---|---|
| *C23C 16/50* | (2006.01) | |
| *C23C 16/04* | (2006.01) | |
| *H01L 51/56* | (2006.01) | |
| *B05D 1/36* | (2006.01) | |
| *B05D 1/32* | (2006.01) | |
| *B05D 1/02* | (2006.01) | |
| *H05K 3/14* | (2006.01) | |
| *H05K 3/42* | (2006.01) | |
| *B05D 5/12* | (2006.01) | |

(56) References Cited

U.S. PATENT DOCUMENTS

| | | | |
|---|---|---|---|
| 2010/0237775 A1* | 9/2010 | Chao | H01L 33/504 |
| | | | 313/506 |
| 2011/0074281 A1* | 3/2011 | Farquhar | H01L 51/5203 |
| | | | 313/504 |
| 2013/0140591 A1* | 6/2013 | Tseng | H01L 33/505 |
| | | | 257/98 |
| 2013/0337597 A1* | 12/2013 | Kawato | H01L 51/56 |
| | | | 438/34 |
| 2015/0159267 A1* | 6/2015 | Ochi | C23C 16/44 |
| | | | 118/721 |
| 2016/0064464 A1* | 3/2016 | Namkung | H01L 27/1225 |
| | | | 257/40 |
| 2016/0372715 A1* | 12/2016 | Seo | C23C 16/455 |
| 2017/0005293 A1* | 1/2017 | Kim | H01L 51/5256 |
| 2017/0125505 A1* | 5/2017 | Oh | H01L 51/52 |
| 2017/0207276 A1* | 7/2017 | Miyamoto | G06F 3/04164 |
| 2017/0256739 A1* | 9/2017 | Kim | G02F 1/133308 |
| 2018/0123060 A1* | 5/2018 | Jang | H01L 27/3276 |
| 2018/0166019 A1* | 6/2018 | Lee | H01L 51/5203 |
| 2018/0188189 A1* | 7/2018 | Hwang | G01N 21/21 |

* cited by examiner

3051 Reducing the mask distance according to a specified width of a second opening on a second inorganic layer pattern in a specified direction

METHOD FOR MANUFACTURING DISPLAY SUBSTRATE

This application claims priority to Chinese Patent Application No. 201711070639.7, filed on Nov. 3, 2017 and titled "METHOD FOR MANUFACTURING DISPLAY SUBSTRATE, DISPLAY SUBSTRATE, DISPLAY PANEL AND DISPLAY DEVICE", the disclosure of which is hereby incorporated by reference in its entirety.

TECHNICAL FIELD

The present disclosure relates to a method for manufacturing a display substrate, a display substrate, a display panel and a display device.

BACKGROUND

At present, in order to realize a narrow frame of a display panel, a portion of the display panel located in a peripheral area is generally folded from a folding area to a non-display surface of the display panel. However, the display substrate of the display panel includes an inorganic layer having a relatively great hardness, and forced folding may cause damages to the display panel. Therefore, the inorganic layer in the folding area is removed firstly before the folding operation is performed.

In a current method for manufacturing a display substrate, an inorganic layer is firstly formed via a chemical vapor deposition (CVD) technique. Afterwards, the portion of the inorganic layer located in the folding area is removed through a patterning process, to form an inorganic layer pattern. By using the above method, the portion of each inorganic layer located in the folding area on the base substrate can be removed.

SUMMARY

There is provided a method for manufacturing a display substrate, a display substrate, a display panel and a display device in the present disclosure.

In a first aspect of the present disclosure, there is provided a method for manufacturing a display substrate, comprising:

disposing a mask plate above a base substrate, the mask plate comprising an occlusion area, an orthographic projection of the occlusion area on the base substrate partially overlapping a folding area of the base substrate; and forming an inorganic layer pattern with an opening on the base substrate by using the mask plate, an orthographic projection of the opening on the base substrate partially overlapping the folding area of the base substrate.

Optionally, the forming an inorganic layer pattern with an opening on the base substrate by using the mask plate comprises:

forming the inorganic layer pattern with the opening on the base substrate via a chemical vapor deposition technique by using the mask plate as a mask; and sequentially forming at least two layers of inorganic layer patterns with the opening on the base substrate by using the mask plate.

Optionally, the sequentially forming at least two layers of inorganic layer patterns with the opening on the base substrate by using the mask plate comprises:

forming a first inorganic layer pattern with a first opening on the base substrate by using the mask plate;

reducing a mask distance, the mask distance being a minimum distance between the mask plate and the base substrate; and forming a second inorganic layer pattern with a second opening on the base substrate by using the mask plate;

wherein orthographic projections of the first opening and the second opening on the base substrate both partially overlap the folding area of the base substrate.

Optionally, the reducing a mask distance comprises:

reducing the mask distance according to a specified width of the second opening on the second inorganic layer pattern in a specified direction, the specified width being negatively correlated with to the mask distance, the specified width being less than or equal to a width of the occlusion area in the specified direction, and the specified direction being parallel to the base substrate.

Optionally, the method further comprises:

disposing a gas diffuser between the mask plate and a nozzle of a reaction gas in the chemical vapor deposition technique.

Optionally, prior to the disposing a mask plate above a base substrate, the method further comprises:

placing the base substrate into a vacuum chamber.

Optionally, the chemical vapor deposition technique comprises a plasma enhanced chemical vapor deposition technique.

In another aspect of the present disclosure, there is provided a display substrate, comprising:

a base substrate; and an inorganic layer pattern with an opening on the base substrate, the inorganic layer pattern being formed on the base substrate by using a mask plate, the mask plate comprising an occlusion area, an orthographic projection of the occlusion area on the base substrate partially overlapping a folding area of the base substrate, and an orthographic projection of the opening on the base substrate partially overlapping the folding area of the base substrate.

Optionally, the inorganic layer pattern comprises a first inorganic layer pattern on the base substrate and a second inorganic layer pattern on a side of the first inorganic layer pattern away from the base substrate, the first inorganic layer pattern and the second inorganic layer pattern both comprising the opening.

Optionally, the opening comprises a second opening on the second inorganic layer pattern and a first opening on the first inorganic layer pattern, a width of the second opening in a specified direction being greater than a width of the first opening in the specified direction, and the specified direction being parallel to the base substrate;

wherein the second inorganic layer pattern is an inorganic layer pattern formed on the base substrate by using the mask plate and reducing a mask distance after the first inorganic layer pattern is formed on the base substrate by using the mask plate, the mask distance being a minimum distance between the mask plate and the base substrate.

Optionally, the inorganic layer pattern comprises at least two layers of inorganic layer patterns with the opening on the base substrate.

Optionally, the display substrate further comprises a peripheral area; wherein the folding area is disposed in the peripheral area.

Optionally, the display substrate further comprises a conductive wire disposed in the folding area, wherein an orthographic projection of the conductive wire on the base substrate overlaps an orthographic projection of the inorganic layer pattern in the folding area.

Optionally, the display substrate is a display substrate in an organic light-emitting diode display panel.

In still another aspect, there is provided a display panel, comprising a display substrate, the display substrate comprising:

a base substrate; and an inorganic layer pattern with an opening on the base substrate, the inorganic layer pattern being formed on the base substrate by using a mask plate, the mask plate comprising an occlusion area, an orthographic projection of the occlusion area on the base substrate partially overlapping a folding area of the base substrate, and an orthographic projection of the opening on the base substrate partially overlapping the folding area of the base substrate.

Optionally, the inorganic layer pattern comprises a first inorganic layer pattern on the base substrate and a second inorganic layer pattern on a side of the first inorganic layer pattern away from the base substrate, the first inorganic layer pattern and the second inorganic layer pattern both comprising the opening.

Optionally, the opening comprises a second opening on the second inorganic layer pattern and a first opening on the first inorganic layer pattern, a width of the second opening in a specified direction being greater than a width of the first opening in the specified direction, and the specified direction being parallel to the base substrate;

wherein the second inorganic layer pattern is an inorganic layer pattern formed on the base substrate by using the mask plate and reducing a mask distance after the first inorganic layer pattern is formed on the base substrate by using the mask plate, the mask distance being a distance between the mask plate and the base substrate.

Optionally, the inorganic layer pattern comprises at least three layers of inorganic layer patterns with the opening on the base substrate.

In still yet another aspect, there is provided a display device, comprising the display panel in the present disclosure.

DETAILED DESCRIPTION

For clearer description of the principle of the present disclosure, the embodiments of the present disclosure are further described with reference to the accompanying drawings.

A narrow-frame display panel has the advantages of large display area proportion (a ratio of an area for displaying image in the display surface of the display panel to a total area of the display surface), good display effect, and immersive watching experience for the audience and the like.

Figure 1:
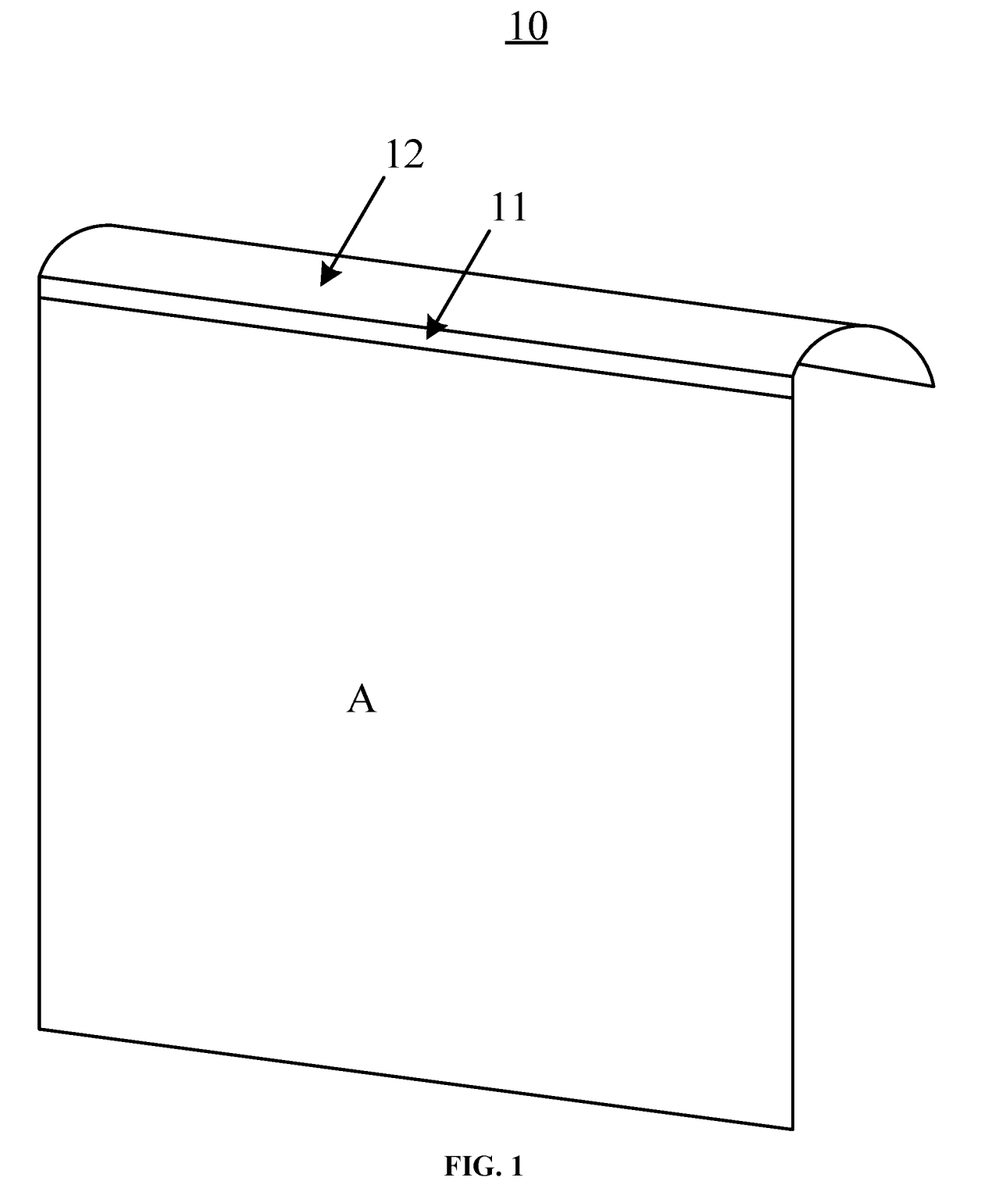
FIG. 1 is a schematic view of a folded display substrate.

FIG. 1 is a schematic view of a folded display substrate. As illustrated in FIG. 1, for practice of the narrow frame of the display panel, a portion of the display panel located in a peripheral area (a pad area) 12 is generally folded from a folding area 11 (the folding area is an area that is predefined for folding) to a non-display surface (an surface opposite to the display surface A) of the display panel 10. However, the display substrate of the display panel 10 includes an inorganic layer having a great hardness, and forced folding may cause damages to the display panel. Therefore, before the folding operation, the inorganic layer in the folding area 11 may be generally removed through a patterning process.

The patterning process generally includes processes such as exposure, development, etching and stripping and the like. In addition, when different portions of the inorganic layer located in the folding area are removed through the patterning process, different mask plates are required, which greatly increases the manufacturing cost.

Figure 2:
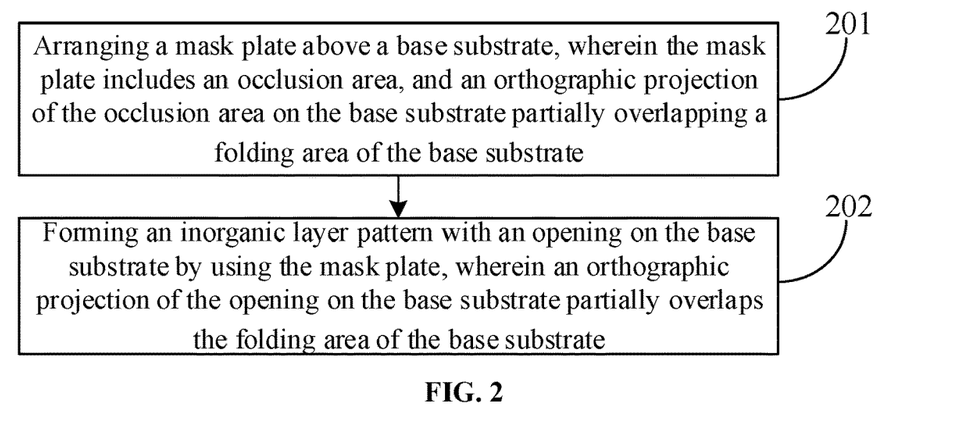
FIG. 2 is a flowchart of a method for manufacturing a display substrate according to an embodiment of the present disclosure.

There is provided a method for manufacturing a display substrate in an embodiment of the present disclosure. FIG. 2 is a flowchart of a method for manufacturing a display substrate according to an embodiment of the present disclosure. As illustrated in FIG. 2, the method for manufacturing a display substrate may include the following steps.

In step 201, a mask plate is arranged above a base substrate, wherein the mask plate includes an occlusion area, and an orthographic projection of the occlusion area on the base substrate partially overlaps a folding area of the base substrate.

In step 202, an inorganic layer pattern with an opening is formed on the base substrate by using the mask plate, wherein an orthographic projection of the opening on the base substrate partially overlaps the folding area of the base substrate.

In summary, in the method for manufacturing a display substrate according to the embodiments of the present disclosure, the folding area of the base substrate is occluded by the mask plate directly. Then the inorganic layer is formed on the base substrate by using the mask plate. Due to the occlusion of the mask plate, the inorganic layer pattern may have an opening in the folding area. Therefore, the portion of the inorganic layer located in the folding area does not needed to be removed through the patterning process, thereby solving the problems that the portion of the inorganic layer located in the folding area needs to be removed through the patterning process, the process is relatively complicated, and the process is time consuming in the prior art, and achieving the effect of conveniently and quickly removing the portion of the inorganic layer located in the folding area.

Figure 3:
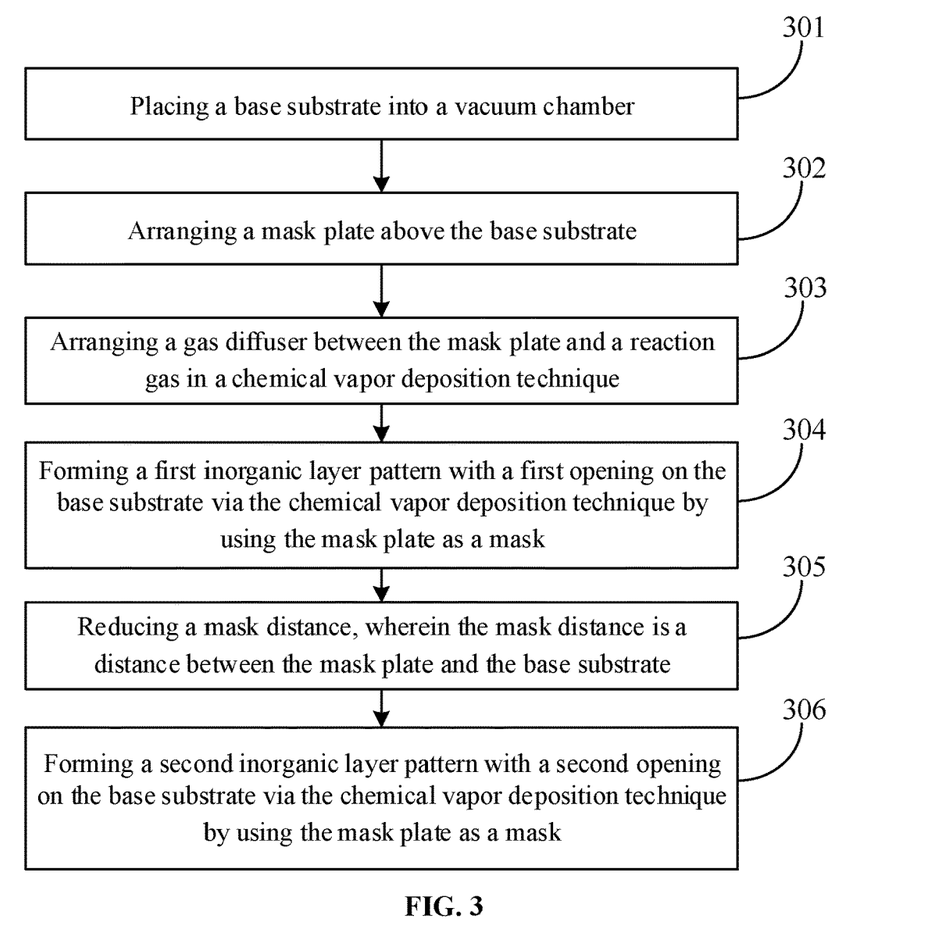
FIG. 3 is a flowchart of a method for manufacturing another display substrate according to an embodiment of the present disclosure.

FIG. 3 is a flowchart of a method for manufacturing another display substrate according to an embodiment of the present disclosure. As illustrated in FIG. 3, the method for manufacturing another display substrate may include the following steps.

In step 301, a base substrate is placed into a vacuum chamber.

During the manufacturing of a display substrate by using the method according to the embodiment of the present disclosure, the base substrate may be firstly placed into the vacuum chamber, to improve the quality of film layers formed in the subsequent steps. The base substrate may be a flexible base substrate, such that the portion of the display substrate located in the peripheral area may be conveniently folded from the folding area to the non-display surface of the display substrate subsequently.

In an embodiment of the present disclosure, the folding area of the base substrate is generally located in the peripheral region of the display substrate, and close to an active area. As such, the portion that is folded to the non-display surface may be enlarged, to further reduce the frame of the display substrate. In step 302, a mask plate is arranged above the base substrate.

The mask plate above the base substrate may be located between a nozzle of a reaction gas and the base substrate. The reaction gas is a reaction gas for forming an inorganic layer. The mask plate may be used to define a shape of an inorganic layer pattern formed by the reaction gas ejected from the nozzle on the base substrate.

It should be noted that a conductive wire crossing the peripheral area and the active area (AA) may be present in the display substrate. The inorganic layer may serve as an insulating layer of the conductive wire. Therefore, an orthographic projection of the conductive wire on the base substrate may not overlap an orthographic projection of an occlusion area of the mask plate on the base substrate, such that the reaction gas can form an insulating layer in the area where the conductive wire is located.

Figure 4:
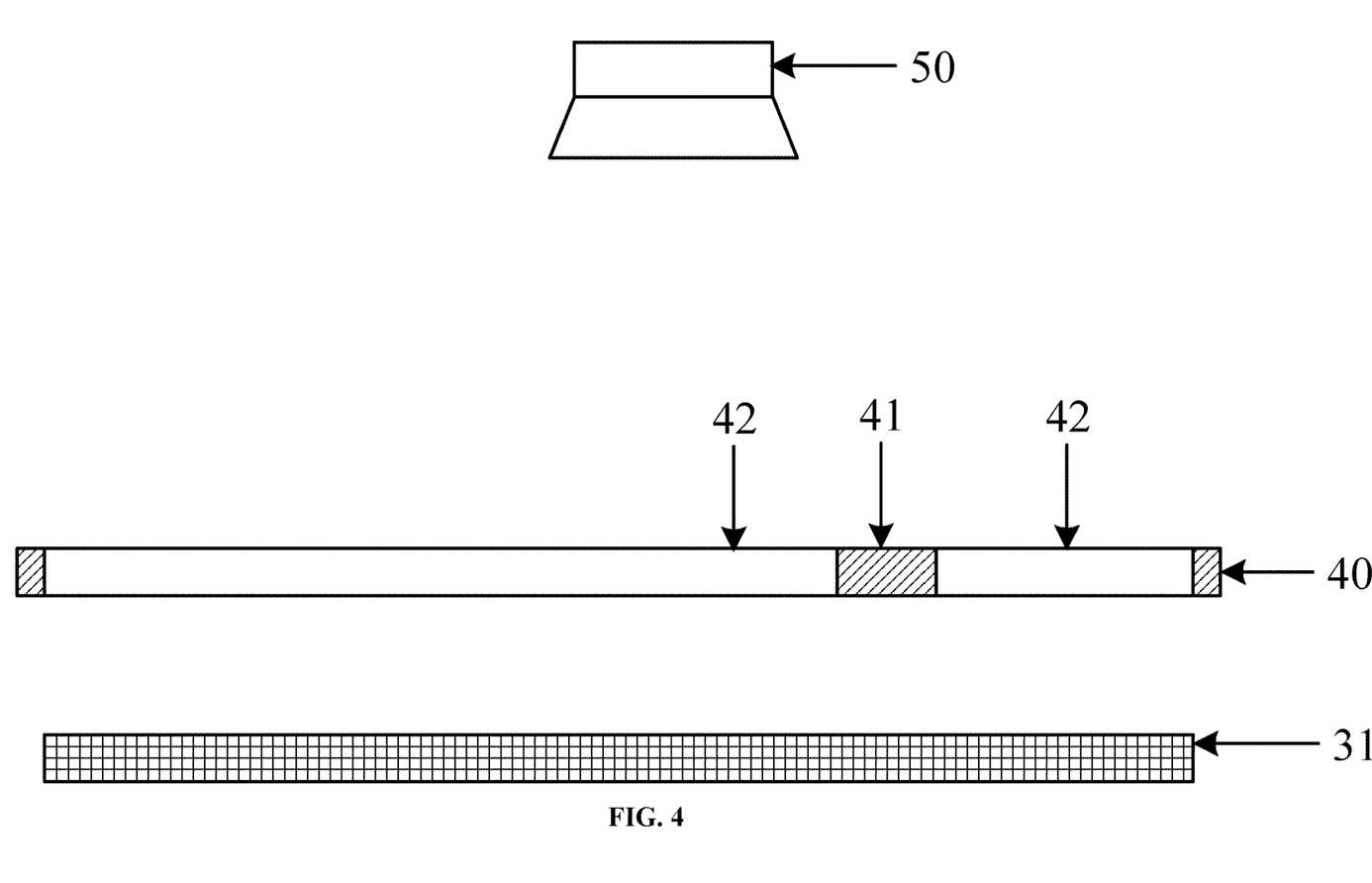
FIG. 4 is a schematic view of structures of a base substrate, a nozzle and a mask plate in the method for manufacturing a display substrate as illustrated in FIG. 3.

FIG. 4 is a schematic view of structures of a base substrate, a nozzle and a mask plate in the method for manufacturing a display substrate as illustrated in FIG. 3. As illustrated in FIG. 4, upon completion of the step 302, the mask plate 40 may include an occlusion area 41 and an opening area 42.

Still referring to FIG. 3, in step 303, a gas diffuser 60 is arranged between the mask plate and a reaction gas in a chemical vapor deposition technique.

The gas diffuser is configured to enable a reaction gas ejected from the nozzle to be uniformly diffused to various areas of the base substrate (except for the area occluded by the occlusion area of the mask plate).

Figure 5:
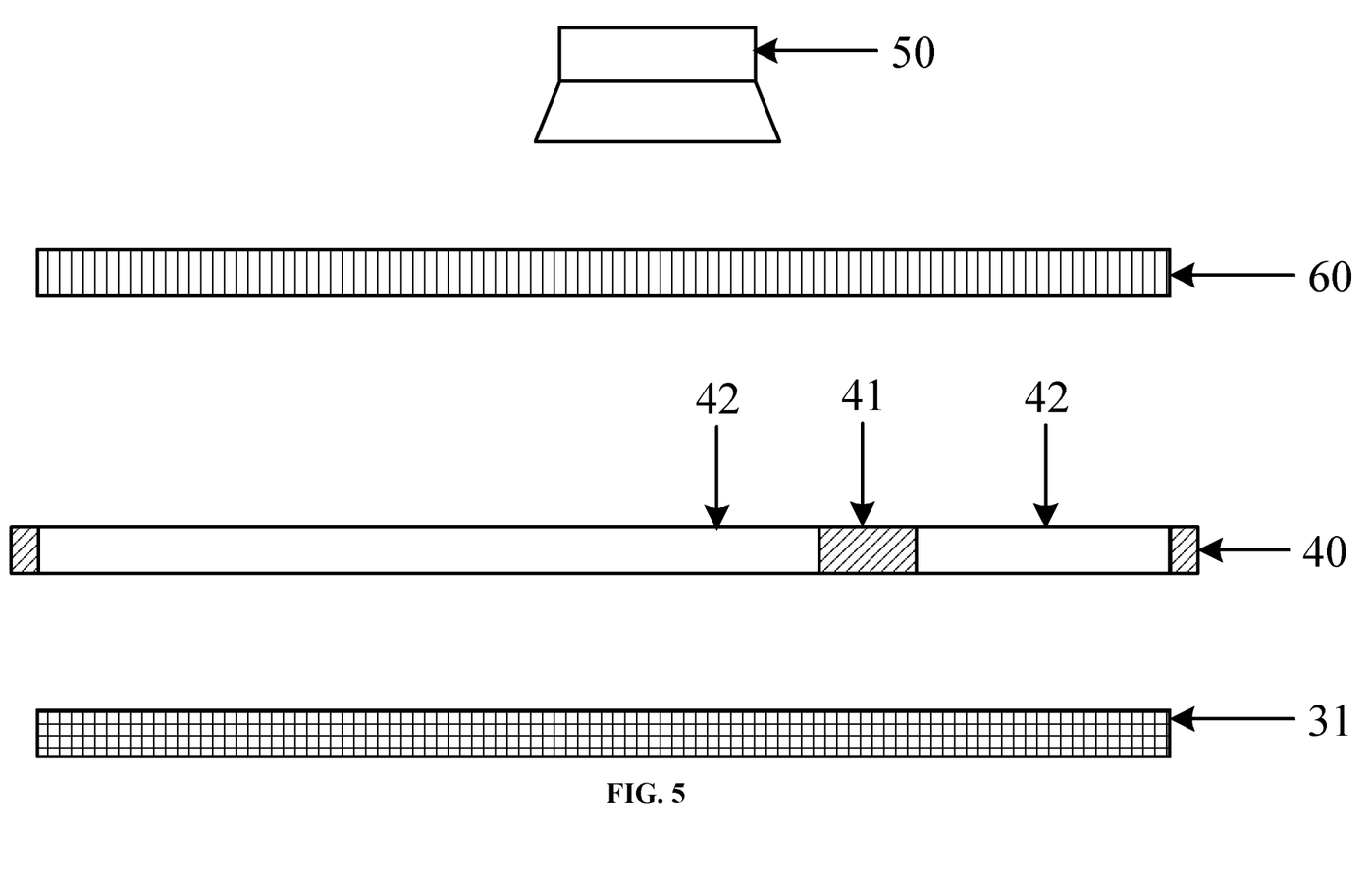
FIG. 5 is a schematic view of structures of a base substrate, a nozzle, a mask plate and a gas diffuser in the method for manufacturing a display substrate as illustrated in FIG. 3.

FIG. 5 is a schematic view of structures of the base substrate 31, the nozzle 50, the mask plate 40 and the gas diffuser 60 in the method for manufacturing a display substrate as illustrated in FIG. 3. As illustrated in FIG. 5, upon completion of the step 303, after being diffused by the gas diffuser 60, the reaction gas ejected by the nozzle 50 may be uniformly floated toward the base substrate 31.

Still referring to FIG. 3, in step 304, a first inorganic layer pattern with a first opening is formed on the base substrate via the chemical vapor deposition technique by using the mask plate as a mask.

The chemical vapor deposition (CVD) technique used in the embodiments of the present disclosure may be the plasma enhanced chemical vapor deposition (PECVD) technique, which has the advantages of high film formation speed, good film formation quality and the like. In addition, in the embodiments of the present disclosure, the first inorganic layer pattern may also be formed via other CVD techniques, for example, an atmospheric pressure CVD technique, a sub-atmospheric pressure CVD technique, an ultrahigh vacuum CVD technique, a high-density plasma CVD technique or the like, which are not limited in the embodiments of the present disclosure.

Figure 6:
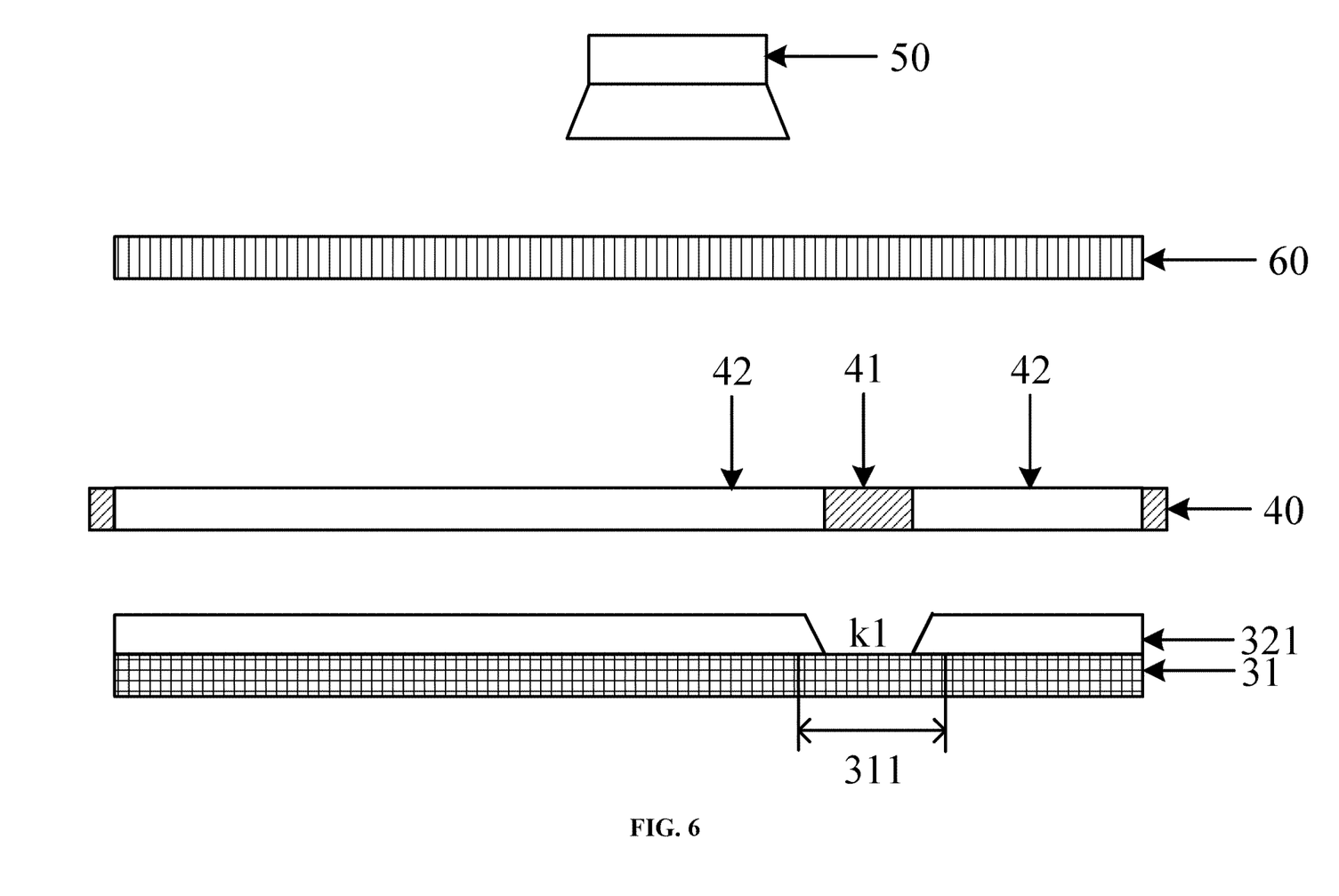
FIG. 6 is a schematic view of the base substrate and other structures after the first inorganic layer pattern is formed in the method for manufacturing a display substrate as illustrated in FIG. 3.

FIG. 6 is a schematic view of the base substrate and other structures after the first inorganic layer pattern is formed in the method for manufacturing a display substrate as illustrated in FIG. 3. In FIG. 6, upon completion of the step 304, the base substrate, and other structures after a first inorganic layer pattern 321 is formed are illustrated. The first inorganic layer pattern 321 is formed on the base substrate. The first inorganic layer pattern 321, under occlusion by the occlusion area 41 of the mask plate 40, forms a first opening k1 on a folding area 311 of the base substrate 31. An orthographic projection of the first opening k1 on the base substrate 31 partially overlaps the folding area 311 of the base substrate 31.

In FIG. 6, denotations of other reference numerals may be referenced to FIG. 5, which are not described herein any further.

Before the inorganic layer is formed on the base substrate, other film layer structures may also be formed, which may be specifically referenced to the related art and are not described herein any further.

Still referring to FIG. 3, in step 305, a mask distance is reduced, wherein the mask distance is a distance between the mask plate and the base substrate.

After the first inorganic layer pattern is formed, other inorganic layers may be continuously formed. However, if the distance between the mask plate and the base substrate is not modified but another inorganic layer is continued to be formed directly in the base substrate where the organic layer is formed, an opening collaboratively formed by the openings of the two formed inorganic layers has a great slope angle (an included angle between a side wall of the opening and the base substrate). However, a greater slope angle may result in problems such as fracture at the opening or the like, which is unfavorable to subsequent formation of the film layers. The closer the distance between the mask plate and the base substrate, the greater the opening of the formed inorganic layer pattern in the folding area. Therefore, according to the embodiment of the present disclosure, before another inorganic layer is formed on the base substrate, the distance between the mask plate and the base substrate may be firstly reduced.

Figure 7:
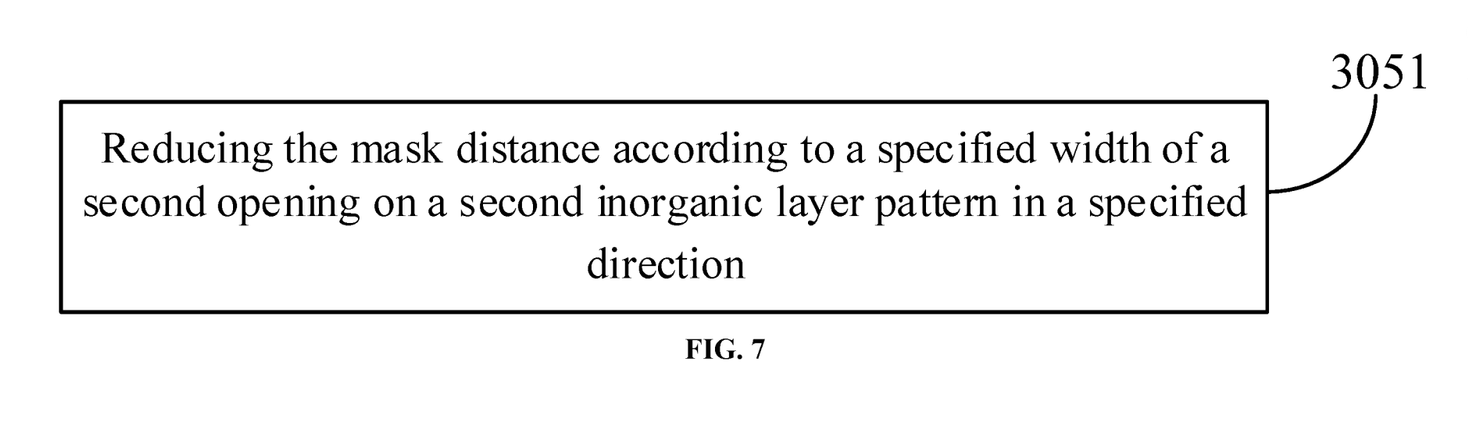
FIG. 7 is a flowchart of forming a second inorganic layer pattern in the method for manufacturing a display substrate as illustrated in FIG. 3.

FIG. 7 is a flowchart of forming a second inorganic layer pattern in the method for manufacturing a display substrate as illustrated in FIG. 3. As illustrated in FIG. 7, the step 305 may include the following sub-step:

In sub-step 3051, the mask distance is reduced according to a specified width of a second opening on a second inorganic layer pattern in a specified direction.

During the reducing of the mask distance, the specified width of the second opening to be formed on the second inorganic layer pattern in the folding area in the specified direction may be referenced. The specified width of the second opening is negatively correlated to the mask distance (the negative correlation refers to that a changing direction of the specified width is opposite to a changing direction of the mask distance, that is, the greater the specified width, the smaller the mask distance; and on the contrary, the smaller the specified width, the greater the mask distance). The specified direction is a direction that is parallel to the base substrate. The specified width is less than or equal to the width of the occlusion area. The mask distance may be a minimum distance between the mask plate and the base substrate. The mask plate is generally parallel to the base substrate. Therefore, the mask distance may be a distance between the mask plate and the base substrate.

Still referring to FIG. 3, in step 306, a second inorganic layer pattern with a second opening is formed on the base substrate via the chemical vapor deposition technique by using the mask plate as a mask.

After the mask plate is reduced, the width of the second opening of the second inorganic layer pattern in the folding area in the specified direction may be grater than the width of the first opening of the first inorganic layer pattern in the folding area in the specified direction. The two inorganic layers may define a step-like opening in the folding area. An orthographic projection of the first opening on the base substrate partially overlaps the folding area of the base substrate.

Figure 8:
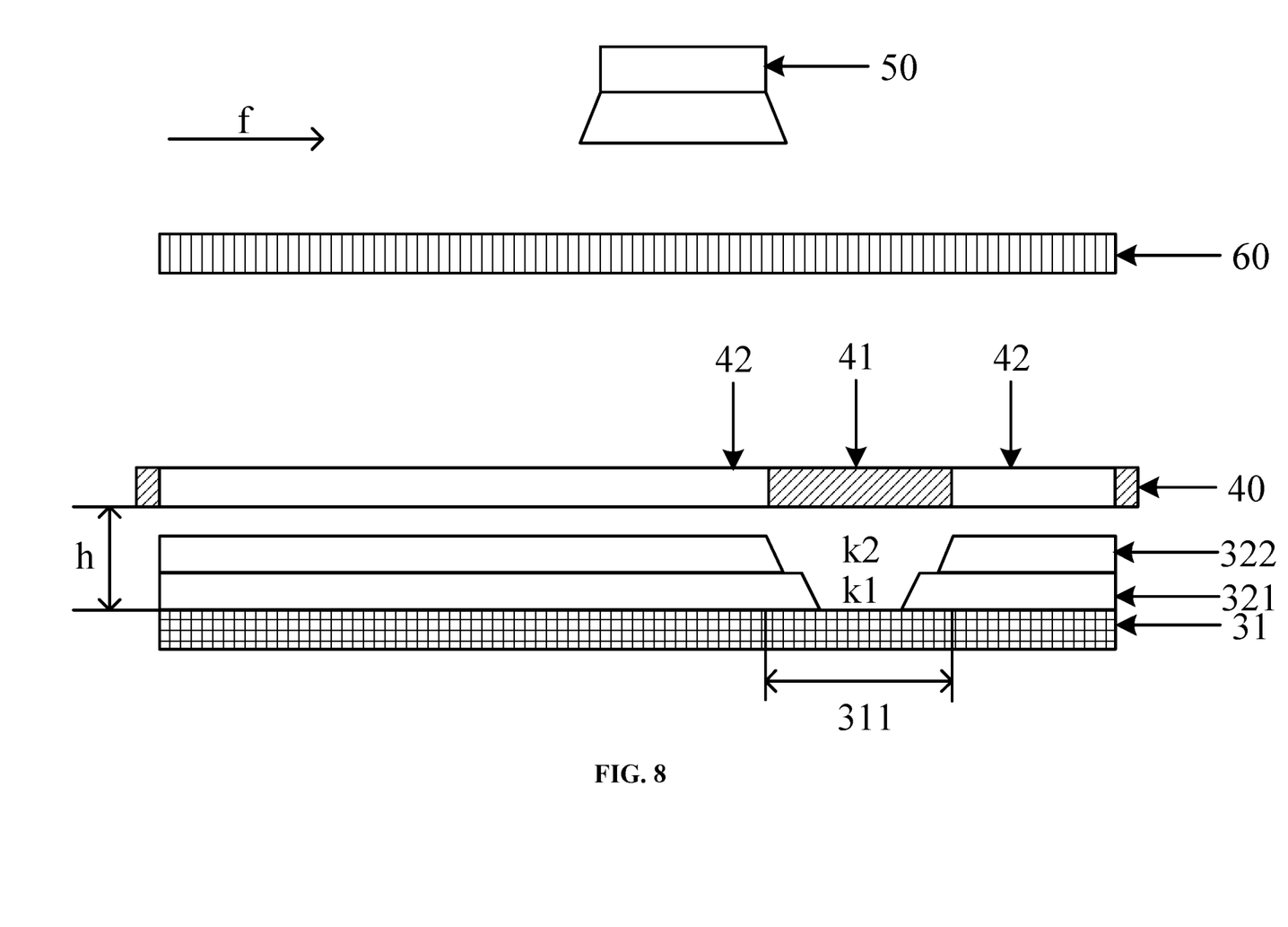
FIG. 8 is a schematic view of a structure of a base substrate on which two inorganic layers are formed in the method for manufacturing a display substrate as illustrated in FIG. 3 and FIG. 7.

FIG. 8 illustrates a schematic view of a structure of a second inorganic layer pattern 322 formed on the base substrate 31 upon completion of the step 306 after a mask distance h between the mask plate 40 and the base substrate 31 is reduced. As can be seen from FIG. 8, a first opening k1 and a second opening k2 formed by the first inorganic layer pattern 321 and the second inorganic layer pattern 322 on a folding area 311 are both in a step-like structure (a width of the second opening k2 in a specified direction f is greater than a width of the first opening k1 in the specified direction f). As a whole, the slope angle of the two opening is small, which causes no impact on formation of the subsequent film layers. In FIG. 8, denotations of other reference numerals may be referenced to FIG. 5, which are not described herein any further.

In addition, in the related art, during the forming of openings at the portions of a plurality of inorganic layers located in the folding area, in order to avoid an over-great slope angle of the opening formed on the plurality of inorganic layers, different mask plates are generally used for different inorganic layers. In the method according to the present disclosure, the effects achieved by using a plurality of mask plates in the related art may be achieved by using only one mask plate, which saves the manufacturing cost of the display substrate.

The step 304 to the step 306 describe the way of forming two inorganic layers. However, at least three inorganic layers in the display substrate may also be formed on the base substrate according to the actual needs. The at least three inorganic layers may include a gate insulating layer, an intermediate dielectric layer and the like.

After a display substrate is manufactured by using the method according to the present disclosure, the portion of the display substrates located in the peripheral area may be folded from the folding area to the non-display surface of the display substrate, to reduce the frame of the display substrate.

In summary, in the method for manufacturing a display substrate according to the embodiment of the present disclosure, inorganic layer patterns with different sizes of openings are formed based on the sequentially decreasing mask distances, such that these inorganic layer patterns define step-like openings in the folding area. In this way, the impacts caused by the openings on the inorganic layer patterns to the formation of the subsequent film layers can be reduced.

Figure 9:
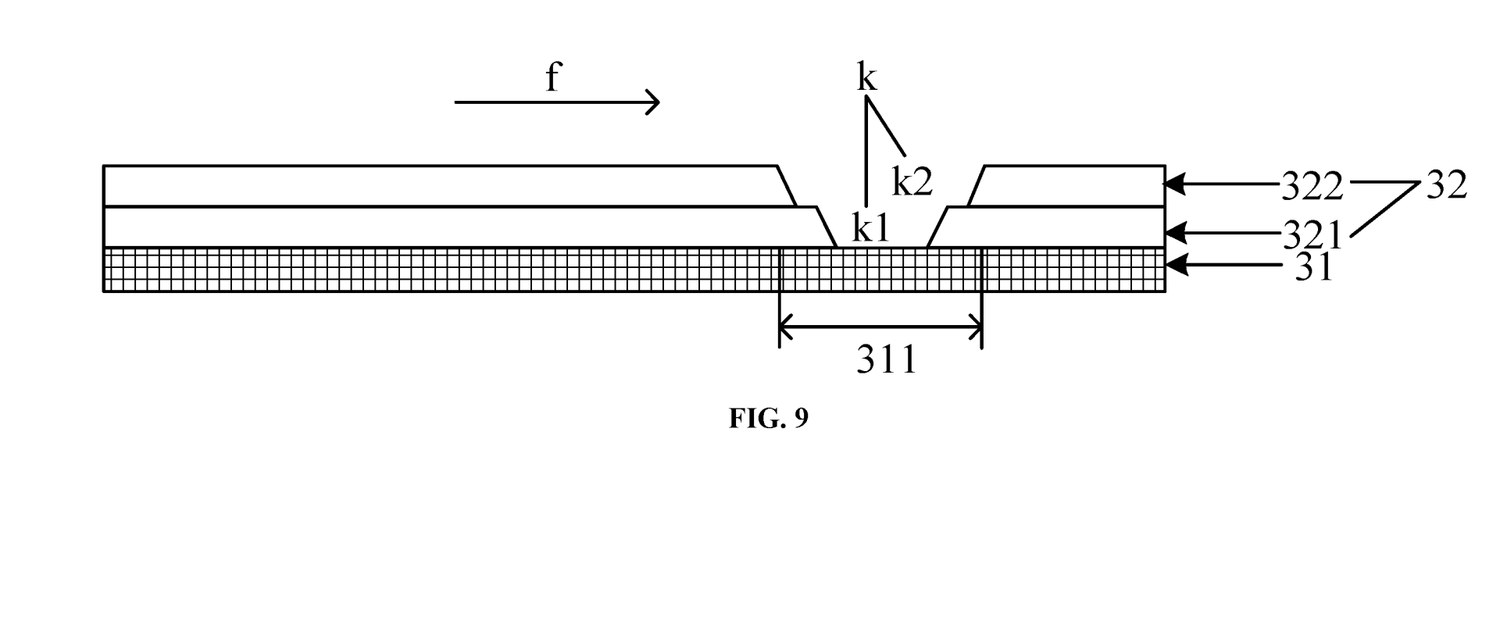
FIG. 9 is a schematic view of a structure of a display substrate according to an embodiment of the present disclosure.

FIG. 9 illustrates a schematic view of a structure of a display substrate according to an embodiment of the present disclosure. The display substrate refers to a display substrate that is manufactured by using the method for manufacturing a display substrate as illustrated in FIG. 2 or by using the method for manufacturing a display substrate as illustrated in FIG. 3.

The display substrate includes a base substrate 31 and an inorganic layer pattern 32 with an opening k on the base substrate 31. An orthographic projection of the opening k on the base substrate 31 partially overlaps the folding area 311 of the base substrate 31.

Herein, the inorganic layer pattern 32 is formed on the base substrate by using a mask plate (not illustrated in FIG. 9). The mask plate includes an occlusion area. An orthographic projection of the occlusion area on the base substrate 31 partially overlaps the folding area 311 of the base substrate 31.

Optionally, the inorganic layer pattern 32 includes a first inorganic layer pattern 321 located on the base substrate 31, and a second inorganic layer pattern 322 located on the first inorganic layer pattern 321.

The first inorganic layer pattern 321 is formed on the base substrate via a chemical vapor deposition technique by using a mask plate arranged between the base substrate 31 and a nozzle as a mask and by using the nozzle as a nozzle of a reaction gas. The first inorganic layer pattern 321 defines a first opening k1 in the folding area 311 on the base substrate 31.

The second inorganic layer pattern 322 is formed via the chemical vapor deposition technique, using the nozzle as the nozzle of the reaction gas and by using the mask plate as the mask, on the base substrate where the first inorganic layer pattern is formed. The second inorganic layer pattern 322 defines a first opening k2 in the folding area 311 on the base substrate 31.

Optionally, the second inorganic layer pattern 322 is an inorganic layer formed on the base substrate 31 by using the mask plate and reducing the mask distance after the first inorganic layer pattern 321 is formed on the base substrate 31 by using the mask plate (not illustrated in FIG. 9). The mask distance may be a minimum distance between the mask plate and the base substrate 31. The width of the second opening k2 on the second inorganic layer pattern 322 in the specified direction f (the specified direction f is parallel to the base substrate 31, that is, the specified direction f is parallel to an extending direction of the base substrate 31) is greater than the width of the first opening k1 on the first inorganic layer pattern 321 in the specified direction f. The first opening k1 and the second opening k2 define a step-like opening in the folding area 311, such that the slope angle of these two openings is small as a whole, and thus no impact is caused to the formation of the subsequent film layers.

Optionally, as illustrated in FIG. 9, the display substrate includes a peripheral area (not illustrated in FIG. 9), and the folding area 311 is located in the peripheral area.

Optionally, as illustrated in FIG. 9, the display substrate includes a conductive wire (not illustrated in FIG. 9) located in the folding area 311. The conductive wire may be a conductive wire crossing the peripheral area and active area of the display substrate, and the inorganic layer pattern 32 may be used as an insulating layer of the conductive wire. An orthographic projection of the conductive wire on the base substrate 31 overlaps an orthographic projection of the inorganic layer pattern in the folding region.

Optionally, the inorganic layer pattern 32 in the display substrate as illustrated in FIG. 9 may further include at least three layers of inorganic layer patterns with an opening on the base substrate (FIG. 9 illustrates two inorganic layer patterns thereof).

Optionally, the display substrate 31 is a display substrate in an Organic Light-Emitting Diode (OLED) display device. Exemplarily, the OLED display panel may be an Active-matrix organic light emitting diode (AMOLED) display panel or other types of OLED display panels.

In summary, in the display substrate according to the embodiments of the present disclosure, the folding area of the base substrate is directly occluded by the mask plate. Then the inorganic layer is formed on the base substrate by using the mask plate. Due to the occlusion of the mask plate, the inorganic layer pattern may have an opening in the folding area. Therefore, the portion of the inorganic layer located in the folding area does not needed to be removed through the patterning process, thereby solving the problems that the portion of the inorganic layer located in the folding area needs to be removed through the patterning process, the process is relatively complicated, and the process is time consuming in the prior art, and achieving the effect of conveniently and quickly removing the portion of the inorganic layer located in the folding area.

In addition, there is further provided a display panel in an embodiment of the present disclosure, comprising the display substrate shown in FIG. 9.

There is further provided a display device, comprising the display panel in the embodiments of the present disclosure.

It should be noted that in the accompanying drawings, for clarity of the illustration, the dimension of the layers and areas may be scaled up. It may be understood that when an element or layer is described as being "above" another element or layer, the described element or layer may be directly on the other element or layer, or at least one intermediate layer may be arranged between the described element or layer and the other element or layer. In addition, it should be understood that when an element or layer is described as being "below" another element or layer, the described element or layer may be directly below the other element or layer, or at least one intermediate layer may be arranged between the described element or layer and the other element or layer. In addition, it should be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals denote like elements.

Persons of ordinary skill in the art can understand that all or part of the steps described in the above embodiments can be completed through hardware (such as a processor, a controller or the like), or through relevant hardware instructed by application stored in a non-transitory computer readable storage medium, such as read-only memory, disk or CD, etc.

The foregoing are only exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A method for manufacturing a display substrate, wherein the display substrate is a base substrate and comprises a display area, a folding area and a peripheral area, and the folding area is located in the peripheral region and close to an active area, the method comprises:
    disposing a mask plate above the base substrate, the mask plate comprising an occlusion area, an orthographic projection of the occlusion area on the base substrate partially overlapping the folding area of the base substrate; and
    forming an inorganic layer pattern with an opening on the base substrate by using the mask plate, an orthographic projection of the opening on the base substrate partially overlapping the folding area of the base substrate; and
    wherein the base substrate is a flexible base substrate and is bent at the folding area;
    wherein the forming an inorganic layer pattern with an opening on the base substrate by using the mask plate comprises:
        sequentially forming at least two layers of inorganic layer patterns with the opening on the base substrate by using the mask plate;
    wherein the sequentially forming at least two layers of inorganic layer patterns with the opening on the base substrate by using the mask plate comprises:
        forming a first inorganic layer pattern with a first opening on the base substrate by using the mask plate;
        reducing a mask distance, the mask distance being a distance between the mask plate and the base substrate; and
        forming a second inorganic layer pattern with a second opening on the base substrate by using the mask plate;
    wherein under occlusion by the occlusion area of the mask plate, the first opening and the second opening are formed by the first and the second inorganic layer patterns and orthographic projections of the first opening and the second opening on the base substrate both partially overlap the folding area of the base substrate.

2. The method according to claim 1, wherein the forming an inorganic layer pattern with an opening on the base substrate by using the mask plate comprises:
    forming the inorganic layer pattern with the opening on the base substrate via a chemical vapor deposition by using the mask plate as a mask.

3. The method according to claim 1, wherein the reducing a mask distance comprises:
    reducing the mask distance according to a specified width of the second opening on the second inorganic layer pattern in a specified direction, the specified width being negatively correlated with the mask distance, the specified width being less than or equal to a width of the occlusion area in the specified direction, and the specified direction being parallel to the base substrate.

4. The method according to claim 2, further comprising:
    disposing a gas diffuser between the mask plate and a nozzle of a reaction gas in a chemical vapor deposition.

5. The method according to claim 2, wherein prior to the disposing a mask plate above a base substrate, the method further comprises:
    placing the base substrate into a vacuum chamber.

6. The method according to claim 2, wherein the chemical vapor deposition comprises a plasma enhanced chemical vapor deposition.

* * * * *